(12) United States Patent
Van De Rijdt et al.

(10) Patent No.: US 11,764,030 B2
(45) Date of Patent: Sep. 19, 2023

(54) STAGE APPARATUS SUITABLE FOR ELECTRON BEAM INSPECTION APPARATUS

(71) Applicant: ASML Netherlands B.V., Veldhoven (NL)

(72) Inventors: Johannes Hubertus Antonius Van De Rijdt, Gemert (NL); Peter Paul Hempenius, Nuenen (NL); Allard Eelco Kooiker, Waalre (NL); Jef Goossens, Bocholt (NL); Petrus Wilhelmus Vleeshouwers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 221 days.

(21) Appl. No.: 16/714,549

(22) Filed: Dec. 13, 2019

(65) Prior Publication Data
US 2020/0194222 A1 Jun. 18, 2020

(30) Foreign Application Priority Data
Dec. 14, 2018 (EP) .................................. 18212802

(51) Int. Cl.
*H01J 37/20* (2006.01)
(52) U.S. Cl.
CPC ....... *H01J 37/20* (2013.01); *H01J 2237/2007* (2013.01)
(58) Field of Classification Search
CPC ............... H01J 37/20; H01J 2237/2007; H01J 2237/0216; H01J 2237/20235

USPC ....................................... 250/440.11, 442.11
See application file for complete search history.

(56) References Cited

U.S. PATENT DOCUMENTS

| | | | | | |
|---|---|---|---|---|---|
| 4,464,030 A | * | 8/1984 | Gale | ................... | G03F 7/70716 347/262 |
| 4,667,415 A | * | 5/1987 | Barsky | ..................... | B23Q 1/36 269/73 |
| 4,887,804 A | * | 12/1989 | Ohtsuka | ................... | B23Q 1/34 269/73 |

(Continued)

FOREIGN PATENT DOCUMENTS

| | | |
|---|---|---|
| CN | 102207240 A | 10/2011 |
| JP | 2008016509 A | 1/2008 |

(Continued)

OTHER PUBLICATIONS

Gilissen et al.*

(Continued)

*Primary Examiner* — David A Vanore
(74) *Attorney, Agent, or Firm* — Finnegan, Henderson Farabow, Garrett & Dunner, LLP

(57) ABSTRACT

Disclosed is a stage apparatus comprising: an object support configured to support an object; a positioning device configured to position the object support; a first connection arrangement configured to connect the object support to the positioning device, the first connection arrangement comprising at least one damped connection; and a second connection arrangement configured to connect the object support to the positioning device, the second connection arrangement comprising at least one substantially rigid connection.

15 Claims, 6 Drawing Sheets

(56) References Cited

U.S. PATENT DOCUMENTS

| | | | | |
|---|---|---|---|---|
| 5,121,898 | A * | 6/1992 | Yasuda | G05D 19/02 248/550 |
| 5,178,357 | A * | 1/1993 | Platus | F16F 3/026 248/619 |
| 5,179,516 | A * | 1/1993 | Choshitani | F16F 15/0275 248/562 |
| 5,653,317 | A * | 8/1997 | Wakui | F16F 15/02 188/378 |
| 5,750,989 | A * | 5/1998 | Lindsay | G01Q 70/02 850/14 |
| 5,812,958 | A * | 9/1998 | Mayama | F16F 15/02 700/280 |
| 5,876,012 | A * | 3/1999 | Haga | F16F 15/0275 248/550 |
| 6,252,234 | B1 * | 6/2001 | Hazelton | F16F 15/02 250/442.11 |
| 6,282,777 | B1 * | 9/2001 | Van De Rijdt | H05K 13/0406 29/740 |
| 6,480,260 | B1 * | 11/2002 | Donders | G03F 7/707 250/492.2 |
| 7,275,627 | B1 * | 10/2007 | Mayama | F16F 7/1005 188/378 |
| 7,686,144 | B2 * | 3/2010 | Shibayama | G03F 7/709 188/378 |
| 7,782,446 | B2 * | 8/2010 | Kamidi | G03F 7/70725 355/75 |
| 8,300,208 | B2 * | 10/2012 | Loopstra | G03F 7/709 355/53 |
| 9,145,945 | B2 * | 9/2015 | Tan | F16F 15/022 |
| 10,802,407 | B2 * | 10/2020 | Aoki | H01L 21/68 |
| 10,852,647 | B2 * | 12/2020 | Aoki | G01B 11/00 |
| 10,935,894 | B2 * | 3/2021 | Aoki | H01L 21/68 |
| 2001/0006762 | A1 * | 7/2001 | Kwan | G03F 7/70716 430/311 |
| 2002/0017749 | A1 * | 2/2002 | Fujita | F16F 15/03 267/140.15 |
| 2004/0008331 | A1 * | 1/2004 | Cox | G03F 7/70758 355/53 |
| 2004/0041316 | A1 * | 3/2004 | Hofschulte | F16F 15/02 267/136 |
| 2004/0255382 | A1 * | 12/2004 | Van De Rijdt | A61B 5/055 5/601 |
| 2005/0056783 | A1 * | 3/2005 | Kley | G01Q 20/00 250/309 |
| 2005/0224687 | A1 * | 10/2005 | Heertjes | F16F 15/02 248/638 |
| 2006/0033043 | A1 * | 2/2006 | Arai | G03F 7/70716 250/492.2 |
| 2007/0103666 | A1 * | 5/2007 | Ottens | G03F 7/707 355/72 |
| 2007/0273074 | A1 * | 11/2007 | Mizuno | B60G 17/0157 267/140.15 |
| 2008/0067967 | A1 | 3/2008 | Butler | |
| 2010/0214548 | A1 * | 8/2010 | Vervoordeldonk | G03F 7/70758 355/72 |
| 2010/0266961 | A1 * | 10/2010 | Kawamura | G03F 7/70716 430/319 |
| 2011/0299054 | A1 * | 12/2011 | Van De Rijdt | G03F 7/70758 355/67 |
| 2012/0175527 | A1 * | 7/2012 | De Boer | H01J 37/16 250/453.11 |
| 2015/0077728 | A1 * | 3/2015 | Laurent | G03F 7/70891 355/30 |
| 2015/0083930 | A1 * | 3/2015 | Matsubara | H01J 37/28 250/423 F |
| 2015/0136994 | A1 * | 5/2015 | Van De Peut | H01J 37/3177 250/396 R |
| 2015/0212435 | A1 * | 7/2015 | Cox | G03F 7/70758 355/72 |
| 2016/0005568 | A1 * | 1/2016 | Mizuochi | H01J 37/20 250/442.11 |
| 2017/0010543 | A1 * | 1/2017 | Aangenent | H01L 21/68 |
| 2017/0011973 | A1 * | 1/2017 | Tingay | H01L 21/6838 |
| 2017/0134631 | A1 * | 5/2017 | Zhao | G06K 9/00664 |
| 2018/0154419 | A1 * | 6/2018 | Ito | B30B 15/0088 |
| 2018/0156296 | A1 * | 6/2018 | Alexander | B32B 7/12 |
| 2018/0267410 | A1 * | 9/2018 | Hempenius | G03F 7/70766 |
| 2018/0299783 | A1 * | 10/2018 | Van Lankvelt | G03F 7/709 |
| 2019/0010320 | A1 * | 1/2019 | Saito | D06F 37/20 |
| 2019/0129317 | A1 * | 5/2019 | Ronde | G03F 7/70766 |
| 2019/0259566 | A1 * | 8/2019 | Enomoto | F16F 15/08 |
| 2019/0341224 | A1 * | 11/2019 | Hempenius | H01J 37/20 |
| 2020/0194222 | A1 * | 6/2020 | Van De Rijdt | H01J 37/20 |
| 2020/0201196 | A1 * | 6/2020 | Ronde | H01L 21/67259 |
| 2020/0203117 | A1 * | 6/2020 | Van Banning | H01J 37/20 |
| 2020/0357601 | A1 * | 11/2020 | Enomoto | F16F 15/022 |

FOREIGN PATENT DOCUMENTS

| | | |
|---|---|---|
| TW | I303355 B | 11/2008 |
| TW | 201530265 A | 8/2015 |

OTHER PUBLICATIONS

The Office Action issued by the Intellectual Property Office (IPO) in related ROC Patent Application No. TW 108145445, dated Nov. 24, 2020 (10 pgs.).

* cited by examiner

STAGE APPARATUS SUITABLE FOR ELECTRON BEAM INSPECTION APPARATUS

RELATED APPLICATIONS

The present application claims priority to European Application No. 18212802.5, filed on Dec. 14, 2018, which is hereby incorporated by reference in its entirety.

FIELD

The present description relates to a stage positioning device for an electron beam inspection apparatus configured to inspect a specimen such as semiconductor device.

BACKGROUND

In the semiconductor processes, defects are inevitably generated. Such defects may impact device performance even up to failure. Device yield may thus be impacted, resulting in increased costs. In order to control semiconductor process yield, defect monitoring is important. One tool useful in defect monitoring is an SEM (Scanning Electron Microscope) which scans a target portion of a specimen using one or more beams of electrons.

Objects, such as wafers or substrates which are inspected by an inspection apparatus, such as an SEM, are subject to positional errors, and in particular to both dynamic (e.g., vibrational) positional errors and thermal positional errors. It would be desirable to mitigate for one, and preferably both, of these positional error contributors.

SUMMARY

In some embodiments of the present disclosure, a stage apparatus is provided. The stage apparatus comprising: an object support configured to support an object; a positioning device configured to position the object support; a first connection arrangement configured to connect the object support to the positioning device, the first connection arrangement comprising at least one damped connection; and a second connection arrangement configured to connect the object support to the positioning device, the second connection arrangement comprising at least one substantially rigid connection.

Other aspects of the disclosed embodiments comprise a particle beam apparatus, an e-beam apparatus, an e-beam inspection apparatus, a lithography apparatus, a metrology apparatus, or a vacuum apparatus, comprising the stage apparatus, wherein, in case of the vacuum apparatus, the vacuum apparatus comprises a vacuum chamber and at least part of the stage apparatus is arranged in the vacuum chamber.

Further aspects, features and advantages, as well as the structure and operation of various embodiments of the present disclosure are described in detail below with reference to the accompanying drawings. It is noted that the embodiments of the present disclosure are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the present disclosure will now be described, by way of example, with reference to the accompanying drawings in which.

DETAILED DESCRIPTION

Figures 1A, 1B:
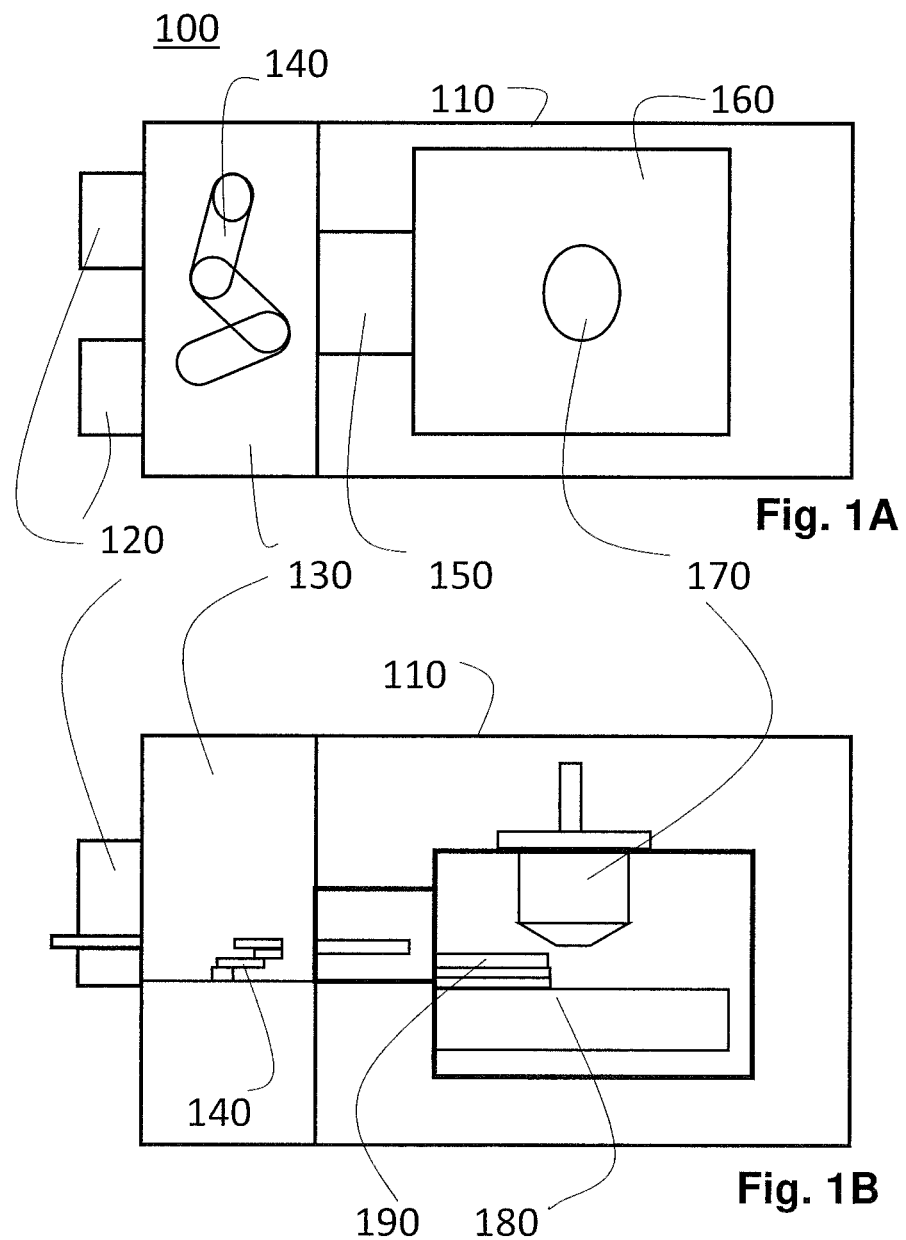
FIGS. 1A and 1B are schematic illustrations of an e-beam inspection tool according to some embodiments of the present disclosure.

Various example embodiments of the present disclosure will now be described more fully with reference to the accompanying drawings in which some example embodiments of the present disclosure are shown. In the drawings, the thicknesses of layers and regions may be exaggerated for clarity.

Detailed illustrative embodiments of the present disclosure are disclosed herein. However, specific structural and functional details disclosed herein are merely representative for purposes of describing example embodiments of the present disclosure. These embodiments may, however, may be embodied in many alternate forms and should not be construed as limited to only the disclosed embodiments set forth herein.

Accordingly, while example embodiments of the disclosure are capable of various modifications and alternative forms, embodiments thereof are shown by way of example in the drawings and will herein be described in detail. It should be understood, however, that there is no intent to limit example embodiments of the disclosure to the particular forms disclosed, but on the contrary, example embodiments of the disclosure are to cover all modifications, equivalents, and alternatives falling within the scope of the disclosure. Like numbers refer to like elements throughout the description of the figures.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

The term "substrate" can be a wafer (as above) or a glass substrate, and the term "patterning device" can be a "reticle", which may also be called as a "mask".

In this disclosure, "axial" means "in the optical axis direction of an apparatus, column or a device such as a lens", while "radial" means "in a direction perpendicular to the optical axis". Usually, the optical axis starts from the cathode and ends at specimen. The optical axis always refers to z-axis in all drawings.

The term, crossover, refers to a point where the electron beam is focused.

The term, virtual source, means the electron beam emitted from the cathode can be traced back to a "virtual" source.

The inspection tool according to the present disclosure relates to a charged particle source, especially to an e-beam source which can be applied to a SEM, an e-beam inspection tool, or an EBDW. The e-beam source, in this art, may also be referred to as an e-gun (Electron Gun).

With respect to the drawings, it is noted that the figures are not drawn to scale. In particular, the scale of some of the elements of the figures may be greatly exaggerated to emphasize characteristics of the elements. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the disclosure are capable of various modifications and alternative forms, embodiments thereof are shown by way of example in the drawings and will herein be described in detail. It should be understood, however, that there is no intent to limit example embodiments to the particular forms disclosed, but on the contrary, example embodiments of are to cover all modifications, equivalents, and alternatives falling within the scope.

FIGS. 1A and 1B schematically depict a top view and a cross-sectional view of an electron beam (e-beam) inspection (EBI) system 100 according to some embodiments of the present disclosure. The example as shown comprises an enclosure 110, a pair of load ports 120 serving as an interface to receive objects to be examined and to output objects that have been examined. The example as shown further comprises an object transfer system, referred as an EFEM, equipment front end module 130, that is configured to handle and/or transport the objects to and from the load ports. In the example as shown, the EFEM 130 comprises a handler robot 140 configured to transport objects between the load ports and a load lock 150 of the EBI system 100. The load lock 150 is an interface between atmospheric conditions occurring outside the enclosure 110 and in the EFEM and the vacuum conditions occurring in a vacuum chamber 160 of the EBI system 100. In the example as shown, the vacuum chamber 160 comprises an electron optics system 170 configured to project an e-beam onto an object to be inspected, e.g. a semiconductor substrate or wafer. The EBI system 100 further comprises a positioning device 180 that is configured to displace the object 190 relative to the e-beam generated by the electron optics system 170. In some embodiments, the positioning device 180 is at least partly arranged within the vacuum chamber 160.

In some embodiments, the positioning device may comprise a cascaded arrangement of multiple positioners such an XY-stage for positioning the object in a substantially horizontal plane, and a Z-stage for positioning the object in the vertical direction.

In some embodiments, the positioning device may comprise a combination of a coarse positioner, configured to provide a coarse positioning of the object over comparatively large distances and a fine positioner, configured to provide a fine positioning of the object over comparatively small distances.

In some embodiments, the positioning device 180 further comprises an object table for holding the object during the inspection process performed by the EBI system 100. In such embodiments, the object 190 may be clamped onto the object table by means of a clamp such as an electrostatic clamp or vacuum clamp. Such a clamp may be integrated in the object table.

In accordance with the present disclosure, the positioning device 180 comprises a first positioner for positioning the object table and a second positioner for positioning the first positioner and the object table.

In some embodiments, the vacuum chamber 160 comprises an electromagnetic shield 1001 to shield of external electromagnetic influences. Such an electromagnetic shield 1001 may also be referred to as an EMI (electromagnetic interference) shield.

In some embodiments, the electromagnetic shield 1001 is configured to shield a detector of the inspection tool 100 from external influences.

Figure 2A:
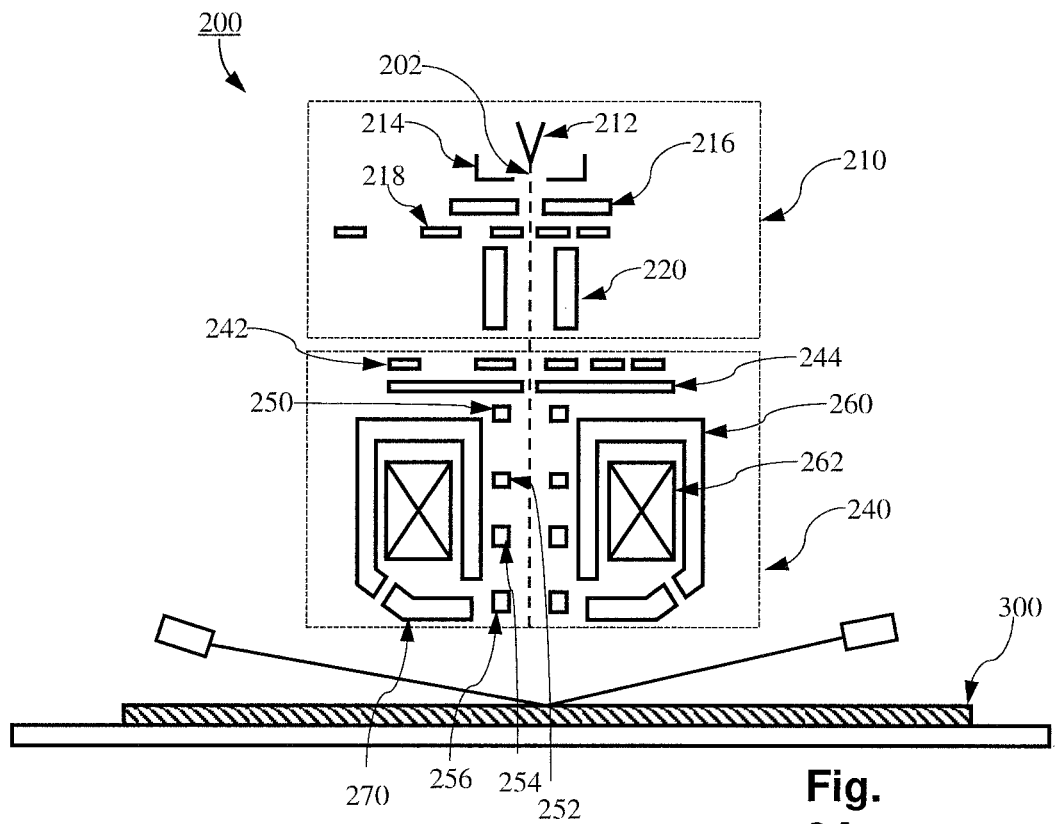
FIGS. 2A and 2B are schematic illustrations of an electron optical system as can be applied in some embodiments of the present disclosure.

FIG. 2A schematically depict an example of an electron optics system 200 as can be applied in e-beam inspection tool or system according to the present disclosure. The electron optics system 200 comprises an e-beam source, referred to as the electron gun 210 and an imaging system 240.

The electron gun 210 comprises an electron source 212, suppressor 214, an anode 216, a set of apertures 218, and a condenser 220. The electron source 212 can be a Schottky emitter. More specifically, the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bended to form a tip for placing the tungsten pin. Next, a ZrO2 is coated on the surface of the tungsten pin, and is heated to 1300° C. so as to be melted and cover the tungsten pin but uncover the pinpoint of the tungsten pin. The melted ZrO2 can make the work function of the tungsten lowered and decrease the energy barrier of the emitted electron, and thus the electron beam 202 is emitted efficiently. Then, by applying negative electricity to the suppressor 214, the electron beam 202 is suppressed. Accordingly, the electron beam having the large spread angle is suppressed to the primary electron beam 202, and thus the brightness of the electron beam 202 is enhanced. By the positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. In order to condense the electron beam 202, the condenser 220 is applied to the electron beam 202, which also provides magnification. The condenser 220 shown in the FIG. 2 may e.g. be an electrostatic lens which can condense the electron beam 202. On the other hand, the condenser 220 can be also a magnetic lens.

Figure 2B:
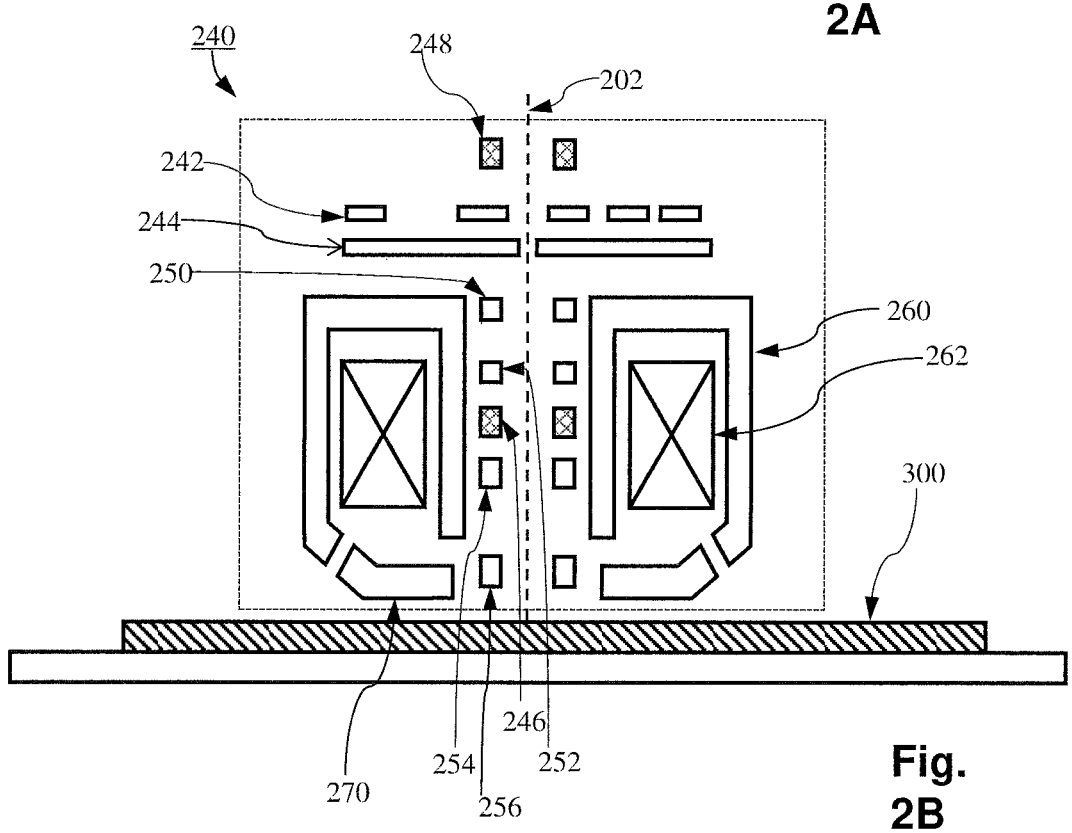

The imaging system 240 as shown in FIG. 2B comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 202, and further has electrostatic lens function due to the combination of upper pole piece and sample 300. Besides, the coil 262 and the yoke 260 are configured to the magnetic objective lens.

The electron beam 202, described above, is generated by heating the electron pin and applying the electric field to anode 216, so that, in order to stabilize the electron beam 202, there must be a long time for heating the electron pin.

For a user end, it is surely time consuming and inconvenient. Hence, the blanker 248 is applied to the condensed electron beam 202 for temporally deflecting the electron beam 202 away from the sample rather than turning off it.

The deflectors 250 and 256 are applied to scan the electron beam 202 to a large field of view, and the deflectors 252 and 254 are used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 202, the retarder 270, the sample 30Q, and the upper pole piece form a lens to eliminate the chromatic aberration of the electron beam 202.

Besides, when the electron beam 202 bombards into the sample 300, a secondary electron may be emanated from the surface of the sample 300. Next the secondary electron is directed to the detector 244 by the filter 246.

Figure 3:
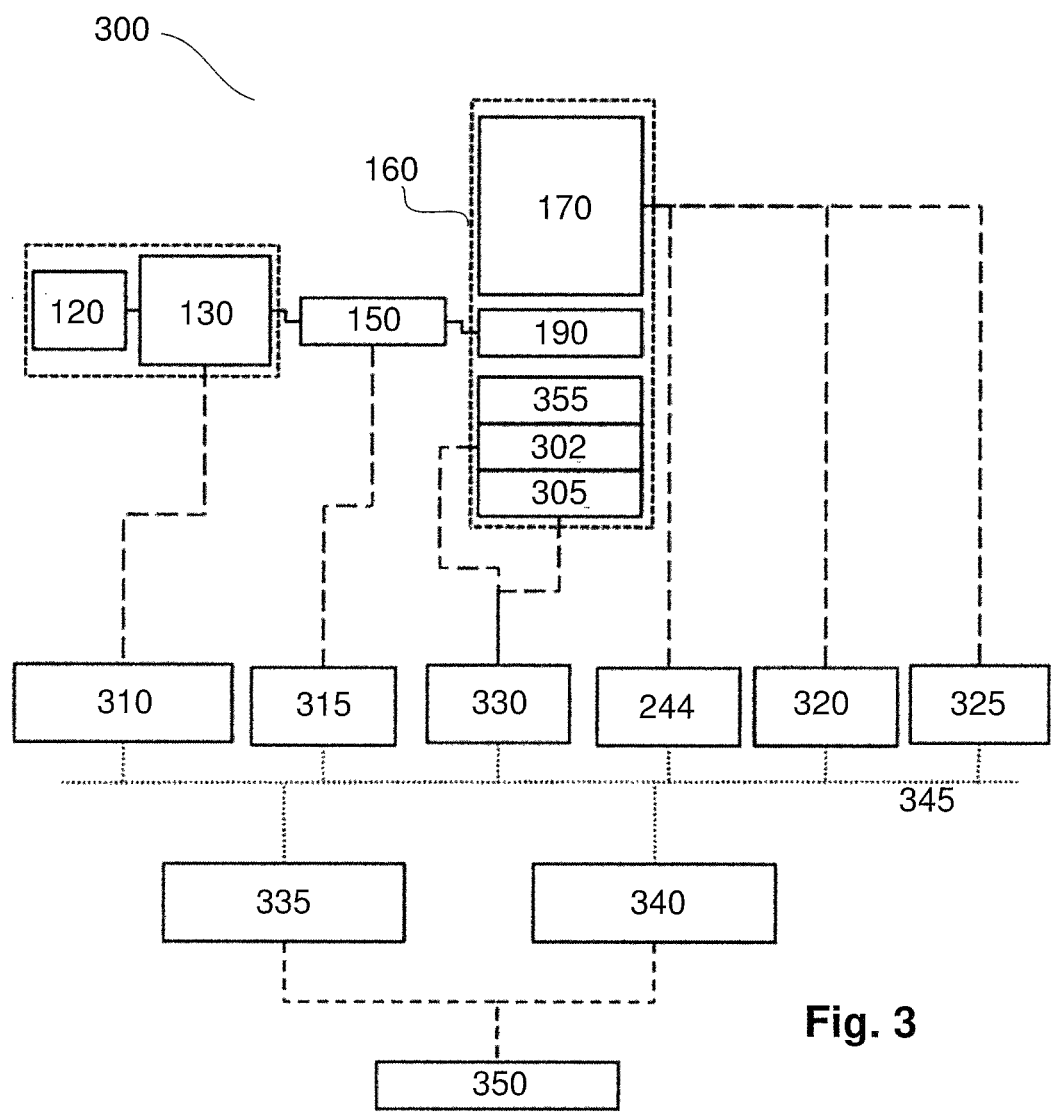
FIG. 3 schematically depicts a possible control architecture of an EBI system.

FIG. 3 schematically depicts a possible control architecture of an EBI system 300. As indicated in FIG. 1, the EBI system comprises a load port 120, an object transfer system 130, a load/lock 150, an electron optics system 170 and a positioning device 180, e.g. including a z-stage 302 and an xy stage 305. As illustrated, these various components of the EBI system may be equipped with respective controllers, i.e., an object transfer system controller 310 connected to the object transfer system 130, a load/lock controller 315, a stage controller 320, a detector controller 320 (for control of detector 244) and an electron optics controller 325. These controllers may e.g. be communicatively connected to a system controller computer 335 and an image processing computer 340, e.g. via a communication bus 345. In the example as shown, the system controller computer 335 and the image processing computer 340 may be connected to a workstation 350.

The load port 120 loads an object 190 (e.g., a wafer) to the object transfer system 130, and the object transfer system controller 310 controls the object transfer system 130 to transfer the object 190 to the load/lock 150. The load/lock controller 315 controls the load/lock 150 to the chamber 160, such that an object 190 that is to be examined can be fixed on a damp 355, e.g. an electrostatic clamp, also referred to as an e-chuck. The positioning device, e.g. the z-stage 302 and the xy-stage 305, enable the object 190 to move under control of the stage controller 330. In some embodiments, a height of the z-stage 302 may e.g. be adjusted using a piezo component such as a piezo actuator. The electron optic controller 325 may control all the conditions of the electron optics system 170, and the detector controller 320 may receive and convert the electric signals from the electron optic system (detector 244) into image signals. The system controller computer 335 is operable to send the commands to the corresponding controller. After receiving the image signals, the image processing computer 340 may process the image signals to identify defects.

In lithographic devices, metrology devices, and inspection devices, such as those described above, an object (such as a substrate or wafer on which the structures have been exposed using the patterned beam, or a reticle (or mask) for patterning a beam in a lithographic apparatus) is positioned accurately using a stage apparatus. Such a stage apparatus may comprise a short stroke stage to position the object support and also comprises a long stroke stage to position the short stroke stage and the object support, where the connection arrangement disclosed herein is configured to at least partially connect the object support to the short stroke stage. The short stroke stage is sometimes referred to as a block or mirror block (as it may comprise one or more mirrors on its surface to enable interferometric position measurement (IFM)).

Throughout the description, the term positioning device will be used, and can be understood to describe any such component, or any other equivalent stage component for positioning a substrate support (e.g. as part of a wafer stage for positioning a wafer). The positioning device supports a substrate support, sometimes referred to as a substrate table/wafer table, chuck or, more specifically when the substrate is retained/clamped onto the substrate support electrostatically, an e-chuck. Throughout the description, the term substrate support will be used and can be understood to describe any such component, or any other equivalent stage component for supporting a substrate. Furthermore, the term stage apparatus will be used to describe the combination of at least the positioning device and substrate support with a connection arrangement connecting them together, and possibly any other component which forms part of a stage apparatus, e.g., motors, measurement devices, clamping components etc. The stage apparatus may be a reticle stage apparatus or a wafer stage apparatus.

The stage apparatus may comprise a positioning device for precise positioning of a substrate support in three orthogonal linear axes and in three orthogonal rotation axes. A substrate can be clamped on the substrate support using an electrostatic force, for example, although other retaining/clamping methods may be used. The positioning device supports the substrate support, e.g., by having the substrate support rigidly mounted on the positioning device. The positioning device (e.g., mirror block) may be provided with mirrors that are part of an interferometer system that is used to at least partly determine the position of the substrate relative to other parts of the inspection apparatus.

However, a drawback of such a stage apparatus is that the substrate support may deform, for example due to heating during inspection (e.g. due to inspection beam radiation or stage actuator heat loads). The deformation of the substrate support may be transferred onto the positioning device, deforming this also, resulting in thermal errors. For example, the deformation of the substrate support can affect the accuracy of the interferometric measurements performed using the mirrors on the positioning device, which in turn affects the precision of positioning the substrate relative to the radiation beam (e.g. an electron beam). Additionally, a thermal error may result from thermal expansion coefficient differences between the substrate support and the positioning device (e.g., the short stroke and/or fine positioning stage). When the stage apparatus forms part of an inspection device or a metrology device, such as an SEM device, such thermal errors can result in image drifts, both in time and position, of up to approximately 200 nm, or more (depending on applications) which may be in the region of two orders of magnitude greater than the required accuracy (for example, image drifts should be maintained below 10 nm).

Another important contributor to stage positioning inaccuracy results from dynamic errors. Dynamic errors may result, for example, from system vibrations such as those which result from positioning of the stage apparatus. Due to high speed positioning and therefore high accelerations of the stage apparatus, the substrate support vibrates during a positioning action (e.g., during an inspection, measurement or patterning process). In particular, vertical (high frequency) vibrational modes, can be excited by such actions, which are typically undamped and are not measurable. In terms of an inspection device or a metrology device, such dynamic errors can result in local XY image shift errors of up to approximately 5 nm or more; these errors should be maintained, for example, below 1 nm.

Figure 4:
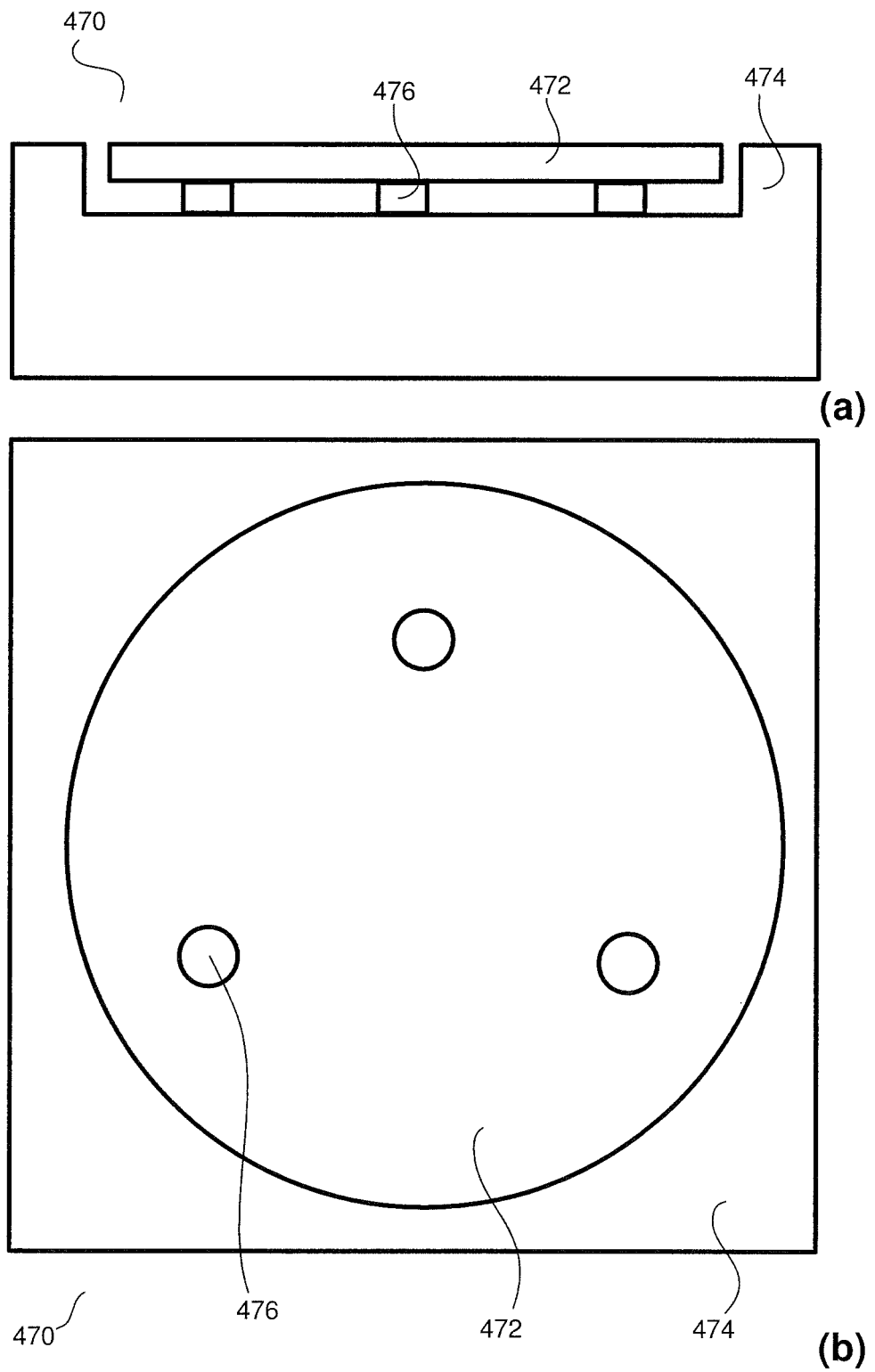
FIG. 4 depicts schematically a stage apparatus comprising block and substrate support as presently used on an inspection apparatus, in (a) front view and (b) plan view.

It has been observed that the connection between positioning device and substrate support has a large influence in positional accuracy. FIGS. 4(a) and (b) show, respectively, a front and plan view of a typical stage apparatus 470. It shows a substrate support 472 mounted upon a positioning device 474. By way of example, the stage apparatus may comprise a wafer stage apparatus for an inspection device, the substrate support 472 comprising an e-chuck and the positioning device 474 comprising a mirror block. The substrate support 472 is connected to the positioning device 474 by stiff mechanical connections 476, in this example three such stiff mechanical connections 476, so as to allow high acceleration without deformation and hysteresis. However, these stiff mechanical connections 476 mean that the aforementioned thermal deformations and dynamic vibrations tend to be transmitted directly from substrate support 472 to the positioning device 474 and/or vice versa.

Figure 5:
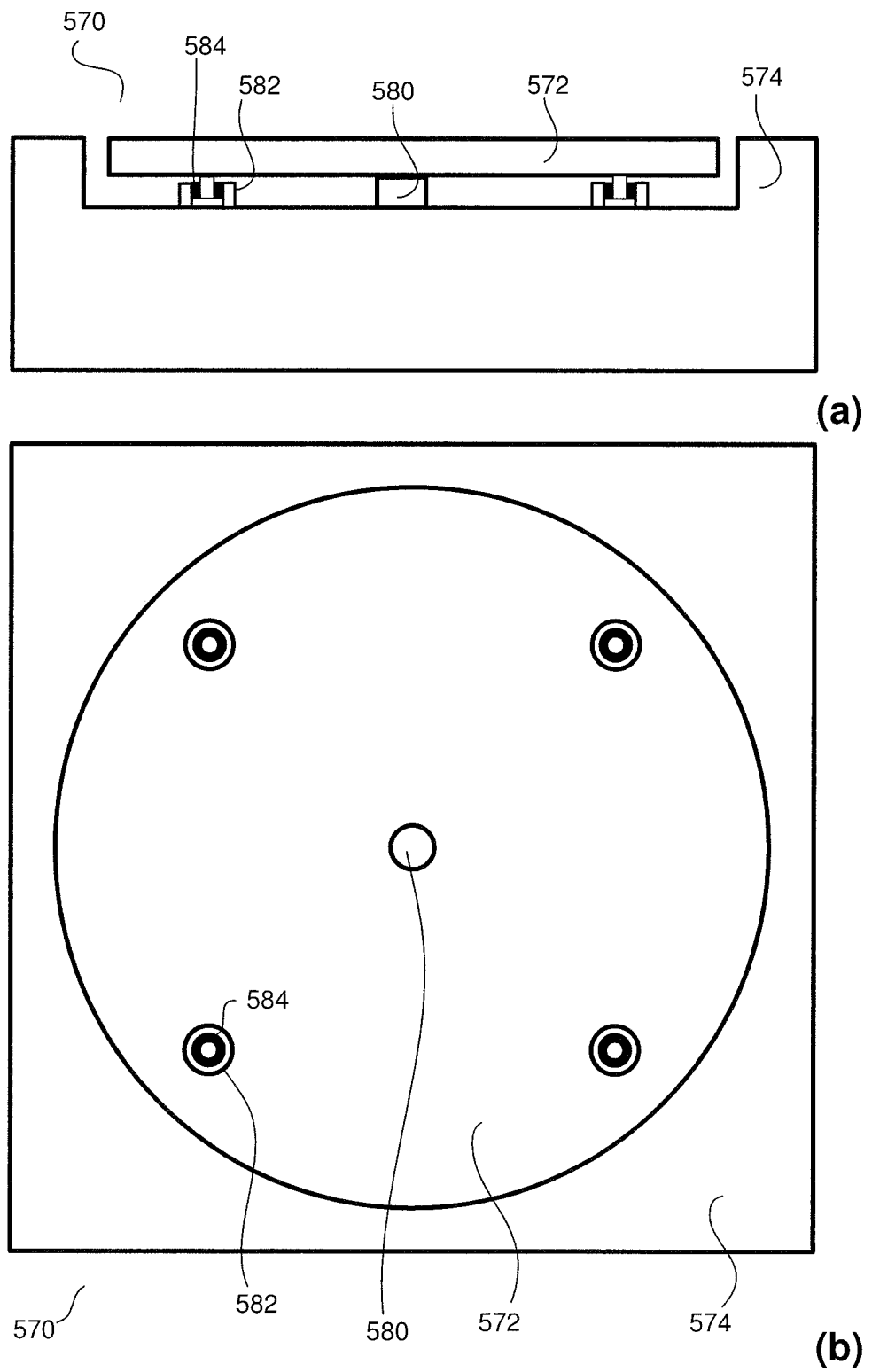
FIG. 5 depicts schematically a stage apparatus comprising block and substrate support according to some embodiments of the present disclosure, in (a) front view and (b) plan view.
Figure 6:
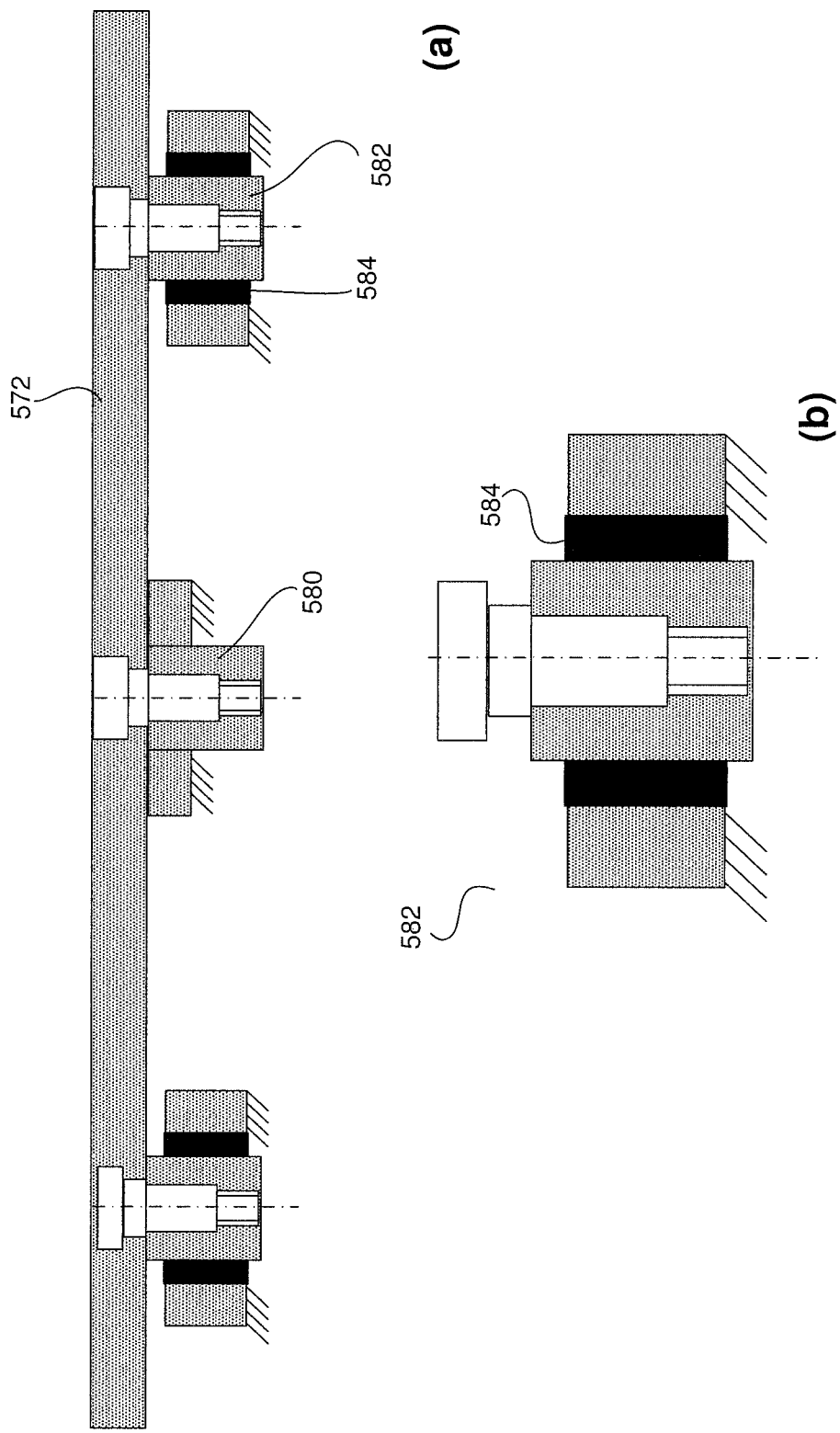
FIG. 6 shows in greater detail, the substrate support depicted in FIG. 5, and its connection arrangement for connecting to the block.

FIGS. 5(a) and (b) show, respectively, a front and plan view of a stage apparatus 570 which addresses the thermal and vibrational issues raised. Once again, the stage apparatus 570 comprises a substrate support 572 mounted upon a positioning device 574, the substrate support 572 and positioning device 574 being essentially similar to substrate support 472 and positioning device 474. However, stage apparatus 570 has a connection arrangement having at least one damped connection. More specifically in this example, connection arrangement comprises connections 580, 582 between substrate support 572 and positioning device 574 which have been optimized to mitigate the thermal and vibrational effects. FIG. 6(a) shows a cross section of the same arrangement (positioning device not shown), in improved detail.

The connections 580, 582 comprise a stiff mechanical connection 580. The Figure shows a single stiff mechanical connection 580. However, a plurality of stiff connections (or also mentioned as rigid connection in this document) is also possible, in another example. Where multiple stiff connections are provided, the damped connections 582 are helpful for dampening the vibration.

In the illustrated example, the (single) stiff mechanical connection 580 may be located at the center of the substrate support 572. More specifically, the stiff mechanical connection 580 may be located at the geometric center or the center of gravity. It can be appreciated that, where there is only a single stiff connection, the location of the stiff connection becomes the center of thermal deformation of the substrate support 572 at which the thermal displacement of the substrate support 572 at the single stiff connection is substantially zero and the substrate support 572 expands or shrinks around the single stiff connection due to the thermal deformation.

The connections 580, 582 also comprise damped connections 582 having damping material 584 in the interface to provide for a damped connection. The damping material may be any suitable material, such as for example, a suitable plastic or rubber material. In the specific example shown, there are four (e.g., evenly spaced) damped connections 582. However, the number of damped connections, and their arrangement on the substrate support 572 can vary. FIG. 6(b) shows a detail of one of the damped connections 582 with damping material 584.

The damping material 584 acts to dampen the vibrations of the substrate support 572 to mitigate their transfer to, and effect on, the positioning device 574. More specifically, the damped connections 582 are such that, at the vibration frequencies (typically between 100-5000 Hz), the damping material comprises a loss factor and/or damping ratio which dampens the (e.g., vertical) mode shapes. Additionally, the damping material should have a low stiffness, i.e., have a low Young's modulus, at low frequencies (e.g., less than 10 Hz or less than 1 Hz). This ensures that the connections are low frequency compliant, to allow deformation of the substrate support 572 without deforming the positioning device 574. This decouples (avoids over-constraining) thermal deformation of the substrate support 572 from the positioning device 574.

Consequently, selection of a suitable damping material should comprising identifying a material which has a high loss factor at higher frequencies (e.g., at around 100 Hz or at around 1000 Hz or above) and also a low Young's modulus, at low frequencies (e.g., less than 1 Hz or 10 Hz). By way of example, a damping material may have a loss factor of greater than 0.2, greater than 1, greater than 1.2 or in the region of 1.4 (at least within a specific frequency range, wherein the specific frequency range is within a further frequency range between 100 Hz and 10 kHz, e.g., at or around 1100 Hz or more). The damping material may also comprise a Young's modulus below 1 GPa, below 0.1 GPa, or more preferably below 0.01 GPa at frequencies of an order of magnitude of 0.1 Hz 1 Hz, and/or 10 Hz; e.g., at 1 Hz).

Further embodiments may be described in the following clauses:

1. A stage apparatus comprising:
   an object support configured to support an object;
   a positioning device configured to position the object support;
   a first connection arrangement configured to connect the object support to the positioning device, the first connection arrangement comprising at least one damped connection; and
   a second connection arrangement configured to connect the object support to the positioning device, the second connection arrangement comprising at least one substantially rigid connection.
2. A stage apparatus according to clause 1, wherein said second connection arrangement comprises only one substantially rigid connection.
3. A stage apparatus according to clause 2, wherein said only one substantially rigid connection is located at a geometric center or a center of gravity of said object support.
4. A stage apparatus according to any preceding clauses, wherein said at least one damped connection comprises a plurality of damped connections.
5. A stage apparatus according to clause 4, wherein said plurality of damped connections comprises three or four damped connections.
6. A stage apparatus according to any preceding clauses, wherein said at least one damped connection is configured to at least dampen a vibration of the object support.

7. A stage apparatus according to clause 6, wherein said at least one damped connection is configured to at least dampen at least one vertical vibrational mode of interest of the object support.
8. A stage apparatus according to any preceding clause, wherein said at least one damped connection comprises a damping material.
9. A stage apparatus according to clause 8, wherein the damping material comprises rubber.
10. A stage apparatus according to clause 8 or 9, wherein the damping material has a high loss factor at frequencies above 100 Hz.
11. A stage apparatus according to any of clauses 8 to 10, wherein the damping material has a loss factor greater than 0.2 at least within a specific frequency range, wherein the specific frequency range is within a further frequency range between 100 Hz and 10 kHz.
12. A stage apparatus according to any of clauses 8 to 10, wherein the damping material has a loss factor greater than 1 at least within the specific frequency range, wherein the specific frequency range is within the further frequency range between 100 Hz and 10 kHz.
13. A stage apparatus according to any of clauses 8 to 10, wherein the damping material has a loss factor greater than 1.2 at least within the specific frequency range, wherein the specific frequency range is within the further frequency range between 100 Hz and 10 kHz.
14. A stage apparatus according to any of clauses 8 to 13, wherein the damping material has a low stiffness at frequencies below 1 Hz or below 10 Hz.
15. A stage apparatus according to clause 14, wherein the damping material has a Young's modulus below 1 GPa at frequencies below 1 Hz or below 10 Hz.
16. A stage apparatus according to clause 14, wherein the damping material has a Young's modulus below 0.1 GPa at frequencies below 1 Hz or below 10 Hz.
17. A stage apparatus according to clause 14, wherein the damping material has a Young's modulus below 0.01 GPa at frequencies below 1 Hz or below 10 Hz.
18. A stage apparatus according to any preceding clauses, wherein said object support comprises an electrostatic clamp and/or a vacuum clamp.
19. A stage apparatus according to any preceding clauses, wherein said positioning device comprises a short stroke stage to position the object support, and comprises a long stroke stage to position the short stroke stage and the object support, and wherein said first and second connection arrangements are configured to at least partially connect the object support to the short stroke stage.
20. A stage apparatus according to any preceding clauses, wherein the object is a substrate or a patterning device.
21. A stage apparatus according to any preceding clauses, wherein the positioning device is configured to control the position of the object support with a positioning error less than 1000 nm.
22. A stage apparatus according to any of clauses 1 to 20, wherein the positioning device is configured to control the position of the object support with a positioning error less than 100 nm, or less than 10 nm.
23. A stage apparatus according to any of clauses 1 to 20, wherein the positioning device is configured to control the position of the object support with a positioning error less than 1 nm or less than 0.1 nm.
24. A metrology apparatus comprising a stage apparatus according to any preceding clause for holding and positioning an object.
25. A metrology apparatus according to clause 24, comprising a scanning electron microscopy inspection apparatus being operable to image one or more features on an object retained by said object support.
26. A lithography apparatus comprising a stage apparatus according to any of clauses 1 to 24, for holding and positioning an object.
27. An apparatus comprising a stage apparatus according to any of clauses 1 to 23 for holding and positioning an object,
wherein the apparatus is a particle beam apparatus, an e-beam apparatus, an e-beam inspection apparatus, a lithography apparatus, a metrology apparatus.
28. An apparatus comprising a stage apparatus as claimed in clauses 1 to 23 for holding and positioning an object, wherein the apparatus is a vacuum apparatus comprising a vacuum chamber and at least part of the stage apparatus is arranged in the vacuum chamber.

To summarize, the combination of damped connections with a stiff center connection results in a stiff horizontal connection of the substrate support to the positioning device, allowing high acceleration without deformation and hysteresis, damping of (e.g., vertical) substrate support vibrational modes of interest, making the system far more accurate after settling and thermal decoupling of the substrate support with respect to the positioning device. By adding damping, the (servo) control of the total stage apparatus becomes simpler, resulting in a more robust and accurate system; additionally, the (servo) control becomes less sensitive to variation in the dynamics. The positioning device may be configured, for example, to control the position of the object support with a positioning error less than 0.1 nm, 1 nm, 10 nm, 100 nm, or 1000 nm.

The stage apparatuses disclosed herein find applicability within, and may comprise part of, a particle beam apparatus, an e-beam apparatus, an e-beam inspection apparatus, a metrology apparatus (including a scatterometer apparatus), a vacuum apparatus, reticle inspection tool or a lithography apparatus for example. In some of the examples, the object may be a reticle (or mask), rather than a substrate (for patterning a beam in a lithographic apparatus), the stage apparatus therefore being a reticle stage.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the embodiments of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments but should be defined only in accordance with the following claims and their equivalents.

The invention claimed is:

1. A stage apparatus comprising:
   an object support configured to support an object;
   a positioning device configured to position the object support;
   a first connection arrangement configured to connect the object support to the positioning device, the first connection arrangement comprising at least one damped connection; and
   a second connection arrangement configured to connect the object support to the positioning device, the second connection arrangement comprising at least one substantially rigid connection.

2. The stage apparatus of claim 1, wherein the second connection arrangement comprises only one substantially rigid connection.

3. The stage apparatus of claim 2, wherein the only one substantially rigid connection is located at a geometric center or a center of gravity of the object support.

4. The stage apparatus of claim 1, wherein the at least one damped connection comprises three or four damped connections.

5. The stage apparatus of claim 1, wherein the at least one damped connection is configured to at least dampen a vibration of the object support.

6. The stage apparatus of claim 1, wherein the at least one damped connection comprises a damping material.

7. The stage apparatus of claim 6, wherein the damping material comprises rubber.

8. The stage apparatus of claim 6, wherein the damping material has a loss factor greater than 0.2, 1, or 1.2 at least within a specific frequency range, wherein the specific frequency range is within a further frequency range between 100 Hz and 10 kHz.

9. The stage apparatus of claim 6, wherein the damping material has a Young's modulus below 1 GPa, 0.1 GPa, or 0.01 GPa at frequencies below 1 Hz or below 10 Hz.

10. The stage apparatus of claim 1, wherein the object support comprises an electrostatic clamp and/or a vacuum clamp.

11. The stage apparatus of claim 1, wherein the positioning device comprises a short stroke stage to position the object support, and comprises a long stroke stage to position the short stroke stage and the object support, and wherein the first and second connection arrangements are configured to at least partially connect the object support to the short stroke stage.

12. The stage apparatus of claim 1, wherein the object is a substrate or a patterning device.

13. The stage apparatus of claim 1, wherein the positioning device is configured to control the position of the object support with a positioning error less than 1000 nm, 100 nm, 10 nm, 1 nm, or 0.1 nm.

14. An apparatus comprising a stage apparatus as claimed in claim 1 for holding and positioning an object, wherein the apparatus is a vacuum apparatus comprising a vacuum chamber and at least part of the stage apparatus is arranged in the vacuum chamber.

15. An apparatus comprising a stage apparatus, wherein the stage apparatus comprises:
   an object support configured to support an object;
   a positioning device configured to position the object support;
   a first connection arrangement configured to connect the object support to the positioning device, the first connection arrangement comprising at least one damped connection;
   a second connection arrangement configured to connect the object support to the positioning device, the second connection arrangement comprising at least one substantially rigid connection; and
   wherein the apparatus is a particle beam apparatus, an e-beam apparatus, an e-beam inspection apparatus, a lithography apparatus, or a metrology apparatus.

* * * * *